United States Patent
Wayland et al.

(10) Patent No.: US 9,263,107 B1
(45) Date of Patent: Feb. 16, 2016

(54) LOAD ISOLATION FOR PAD SIGNAL MONITORING

(71) Applicant: QUALCOMM Incorporated, San Diego, CA (US)

(72) Inventors: Mark Charles Wayland, San Diego, CA (US); Thomas Clark Bryan, San Diego, CA (US); Yu Huang, San Diego, CA (US); Michael Joseph Brunolli, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/535,271

(22) Filed: Nov. 6, 2014

(51) Int. Cl.
*G11C 7/10* (2006.01)
*H03K 3/017* (2006.01)
*H03K 5/156* (2006.01)
*G11C 7/22* (2006.01)

(52) U.S. Cl.
CPC .............. *G11C 7/109* (2013.01); *G11C 7/1051* (2013.01); *G11C 7/1063* (2013.01); *H03K 3/017* (2013.01); *H03K 5/1565* (2013.01); *G11C 7/1066* (2013.01); *G11C 7/222* (2013.01)

(58) Field of Classification Search
CPC ... H03K 5/1565; H03K 3/017; G11C 7/1051; G11C 7/1066; G11C 7/222
USPC .............. 365/233.11, 191, 194; 327/109, 175
See application file for complete search history.

(56) References Cited

U.S. PATENT DOCUMENTS

| | | | |
|---|---|---|---|
| 8,416,001 | B2 | 4/2013 | Ding et al. |
| 8,462,906 | B1 | 6/2013 | Ding |
| 8,674,733 | B2 | 3/2014 | Kim |
| 9,053,774 | B2 * | 6/2015 | Seol ..................... H03K 5/1565 |
| 2007/0024338 | A1 | 2/2007 | Shumarayev et al. |
| 2014/0085123 | A1 | 3/2014 | Roytman et al. |

* cited by examiner

*Primary Examiner* — David Lam
(74) *Attorney, Agent, or Firm* — Arent Fox LLP

(57) ABSTRACT

A driver circuit includes an output driver including a plurality of output driver legs. The driver circuit further includes a duty cycle adjuster configured to adjust a duty cycle of a signal provided to the output driver. The driver circuit further includes an isolation module configured to isolate at least one output driver leg of the output driver legs from remaining output driver legs of the output driver legs. The driver circuit further includes a duty cycle monitor configured to monitor an output of the at least one output driver leg when the at least one output driver leg is isolated from the remaining output driver legs, and to provide the monitored output to the duty cycle adjuster.

21 Claims, 4 Drawing Sheets

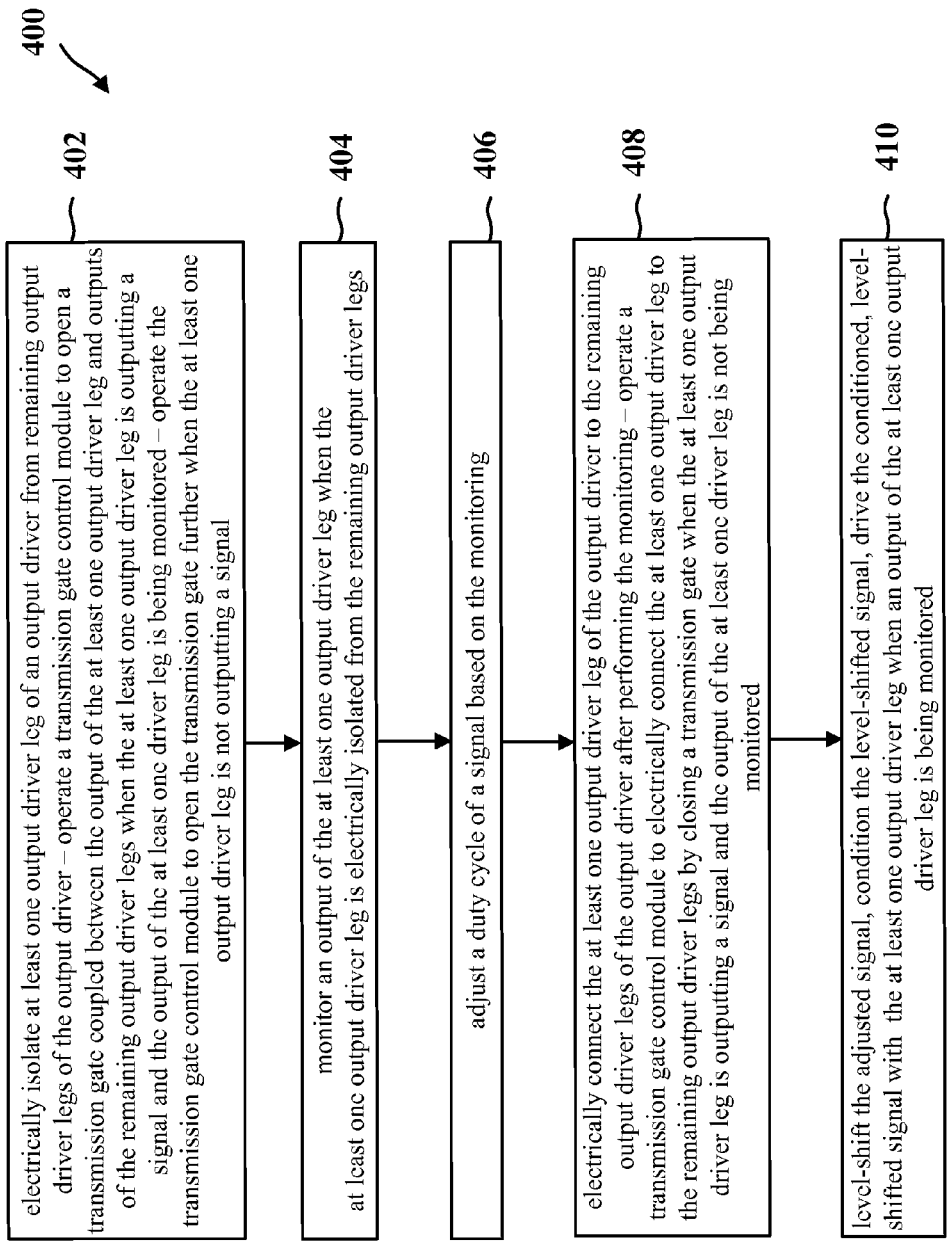

US 9,263,107 B1

LOAD ISOLATION FOR PAD SIGNAL MONITORING

BACKGROUND

1. Field

The present disclosure relates generally to signal monitoring and adjustment, and more particularly, to load isolation for pad signal monitoring.

2. Background

An input/output (IO) driver receives data from a memory controller, level shifts and conditions the data, and outputs the conditioned data to a load, such as, for example, a dynamic random access memory (DRAM). A duty cycle of the data may be adjusted by the IO driver and/or the memory controller. There is currently a need to improve the adjustment of the duty cycle to thereby improve the duty cycle of the data outputted by the IO driver.

SUMMARY

In an aspect of the disclosure, a driver circuit includes an output driver including a plurality of output driver legs. The driver circuit further includes a duty cycle adjuster configured to adjust a duty cycle of a signal provided to the output driver. The driver circuit further includes an isolation module configured to isolate at least one output driver leg of the output driver legs from remaining output driver legs of the output driver legs. The driver circuit further includes a duty cycle monitor configured to monitor an output of the at least one output driver leg when the at least one output driver leg is isolated from the remaining output driver legs, and to provide the monitored output to the duty cycle adjuster.

In an aspect of the disclosure, a method of adjusting a data signal is provided. The method may be performed by a driver circuit. The driver circuit electrically isolates at least one output driver leg of an output driver from remaining output driver legs of the output driver. The driver circuit monitors an output of the at least one output driver leg when the at least one output driver leg is electrically isolated from the remaining output driver legs. The driver circuit adjusts a duty cycle of a signal based on the monitoring.

BRIEF DESCRIPTION OF THE DRAWINGS

FIG. 4 is a flow chart of a method of adjusting a data signal.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
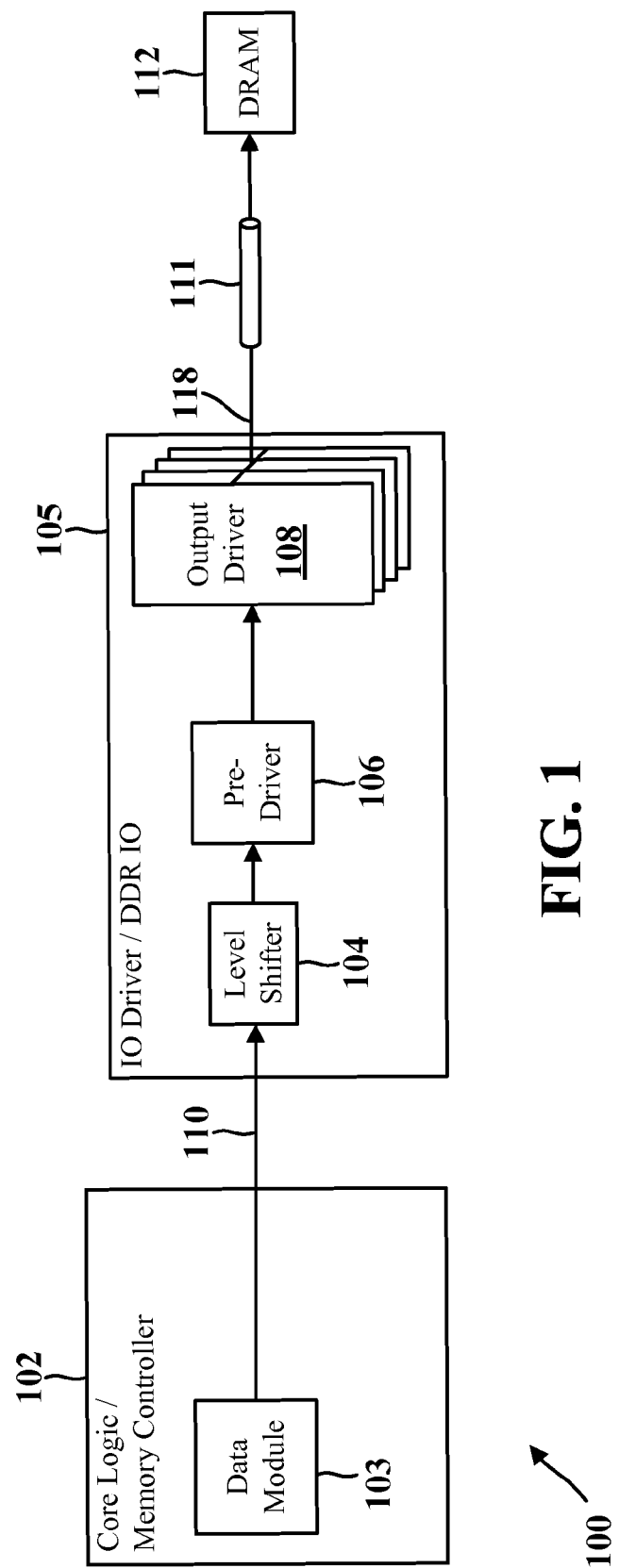
FIG. 1 is a diagram illustrating a standard IO configuration.

FIG. 1 is a diagram illustrating a standard IO configuration 100. Referring to FIG. 1, a standard IO configuration 100 includes a memory controller/core logic 102. The core logic 102 includes a data module 103 that is configured to provide data 110 to an IO driver such as a double data rate (DDR) IO 105. The core logic 102 and the DDR IO 105 may be part of one integrated circuit (IC) located on a single printed circuit board (PCB). In the configuration 100, the data module 103 is configured to send a data signal 110 to a level shifter 104 of the DDR IO 105. The level shifter 104 shifts (e.g., amplifies) a voltage level of the incoming data signal 110. The level shifter 104 outputs the level-shifted data signal to the pre-driver 106, which may include one or more inverters or buffers, and which is configured to condition the level-shifted data signal. The pre-driver 106 outputs the conditioned data signal to an output driver 108. The output driver 108 is configured to receive the conditioned, level-shifted data signal from the pre-driver 106, to output the data signal to a pad (also referred to as pad bump, or pad landing) at node 118, and to drive the data signal across the transmission line/channel 111 to the DRAM 112. The output driver 108 may include a plurality of output driver legs connected in parallel. Each of the output driver legs may have approximately the same output impedance (e.g., 240 ohms at a particular frequency). One or more of the output driver legs may be activated to obtain a smaller output impedance. For example, if at a particular frequency each of the output driver legs has an output impedance of 240 ohms, two output driver legs may be activated to obtain an output impedance of 120 ohms, three output driver legs may be activated to obtain an output impedance of 80 ohms, and four output driver legs may be activated to obtain an output impedance of 60 ohms.

Figure 2:
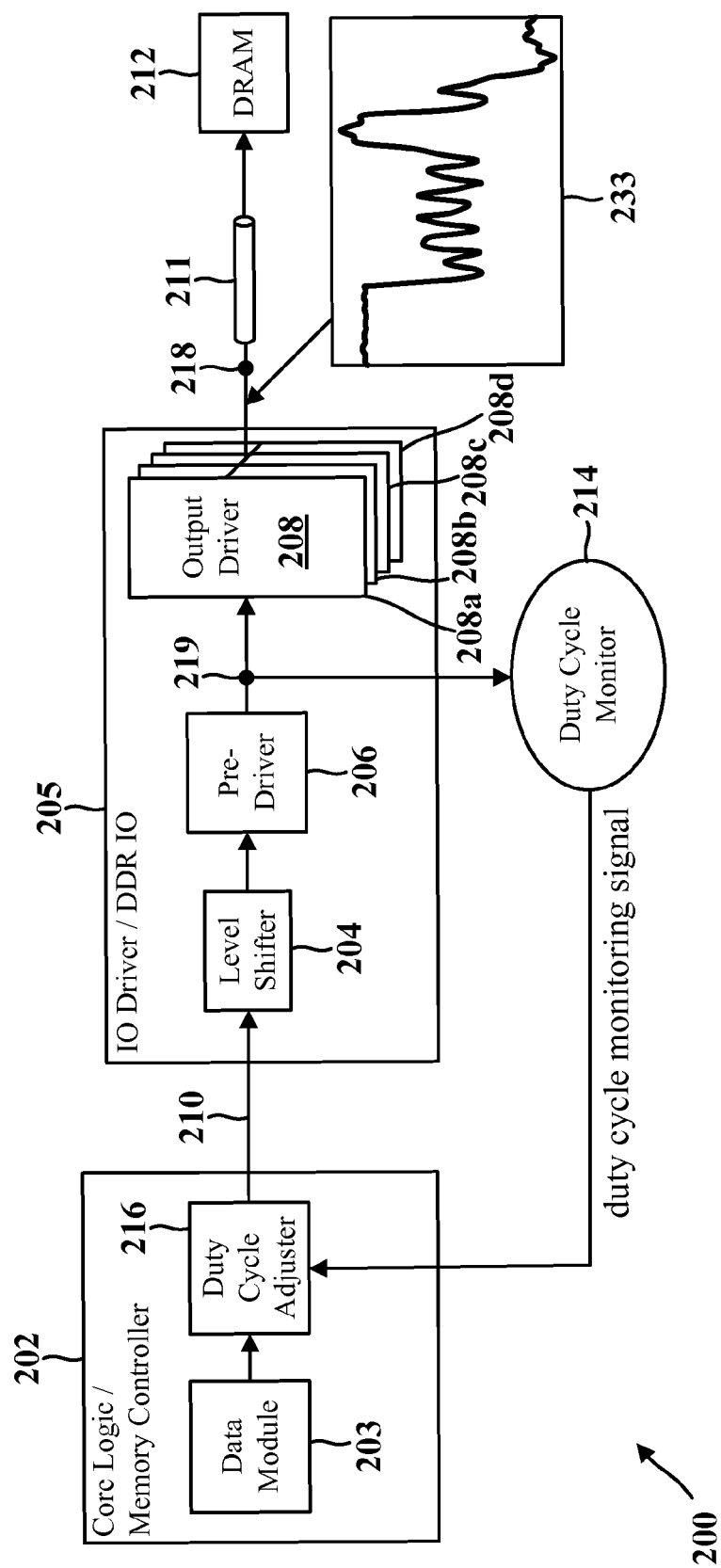
FIG. 2 is a diagram illustrating an IO configuration including a duty cycle monitor and a duty cycle adjuster.

FIG. 2 is a diagram illustrating an IO configuration 200 including a duty cycle monitor 214 and a duty cycle adjuster 216. Referring to FIG. 2, an IO configuration 200 includes a memory controller/core logic 202. The core logic 202 includes a data module 203 and a duty cycle adjuster 216. The data module 203 is configured to provide a data signal to the duty cycle adjuster 216. The duty cycle adjuster 216 is configured to adjust a duty cycle of the data signal, and to output the data signal 210 to an IO driver such as a DDR IO 205. In the configuration 200, the duty cycle adjuster 216 is configured to send the data signal 210 to a level shifter 204 of the DDR IO 205. The level shifter 204 shifts (e.g., amplifies) a voltage level of the incoming data signal 210. The level shifter 204 outputs the level-shifted data signal to the pre-driver 206, which may include one or more inverters or buffers, and which is configured to condition the level-shifted data signal. The pre-driver 206 outputs the conditioned data signal at node 219 to a duty cycle monitor 214 and to an output driver 208. The duty cycle monitor 214 monitors the duty cycle of the output of the pre-driver 206 at node 219, and outputs a duty cycle monitoring signal to the duty cycle adjuster 216. The duty cycle adjuster 216 adjusts a duty cycle of the data signal from the data module 203 based on the duty cycle monitoring signal. The output driver 208 may have a plurality of legs, such as, for example, four legs 208a, 208b, 208c, 208d. The output driver 208 is configured to receive the conditioned, level-shifted data signal from the pre-driver 206, to output the data signal 233 to a pad (also referred to as pad bump, or pad landing) at node 218, and to drive the data signal 233 across the transmission line/channel 211 to the DRAM 212.

As shown in FIG. 2, the duty cycle monitor 214 monitors the duty cycle at the node 219. However, monitoring the duty cycle at the node 219 is less than ideal due to duty cycle distortion introduced by the output driver 208 at node 218. Further, monitoring at node 218 is also less than ideal due to distortion as a result of reflections from the transmission line/channel 211 and/or the DRAM 212. Accordingly, an exemplary driver circuit is provided infra in which the duty cycle monitor 214 monitors at the output of an output driver.

Figure 3:
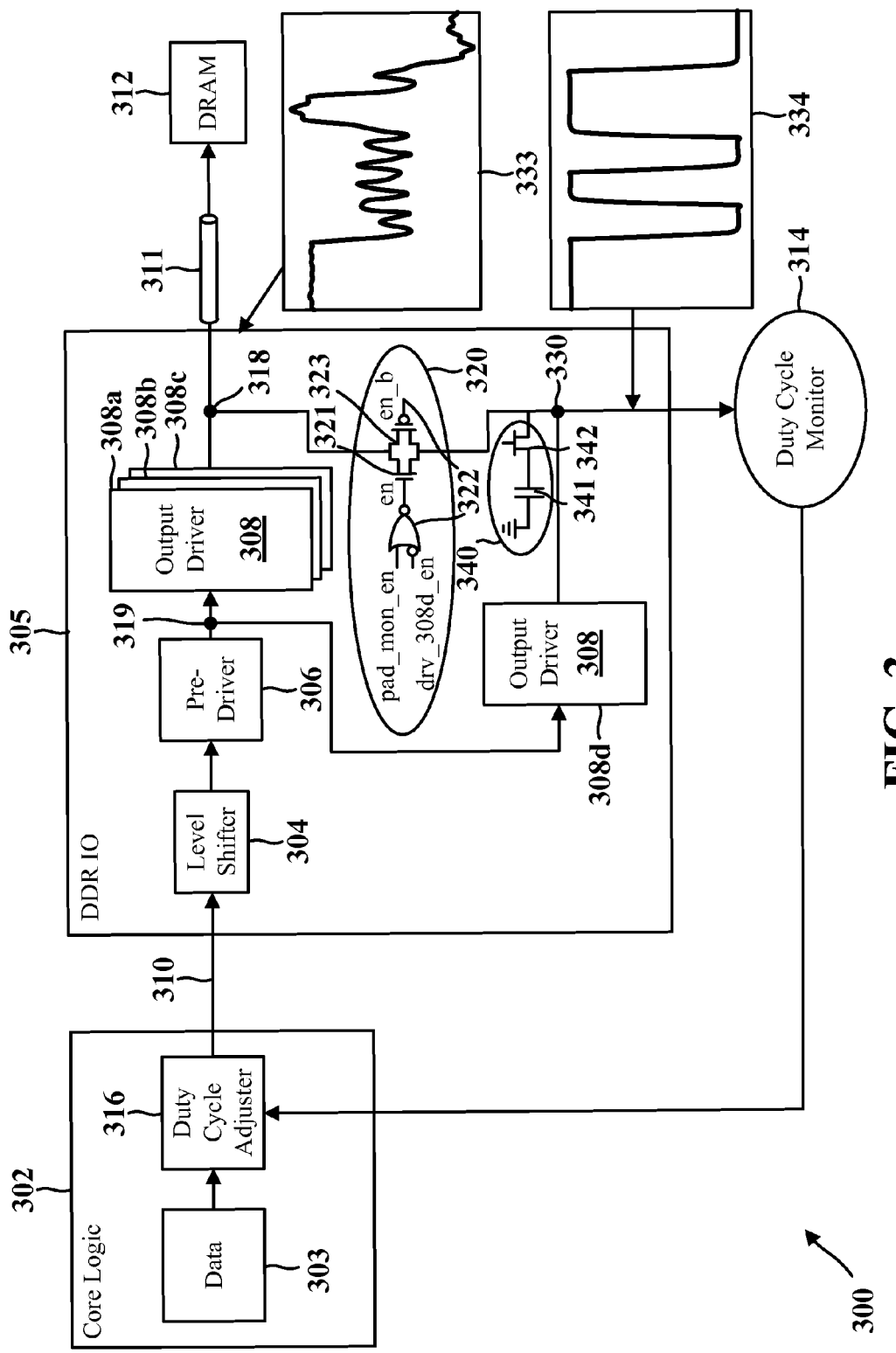
FIG. 3 is a diagram illustrating an IO configuration including a duty cycle monitor and a duty cycle adjuster according to a configuration.

FIG. 3 is a diagram illustrating an exemplary IO configuration 300 including a duty cycle monitor 314 and a duty cycle adjuster 316 according to a configuration. Referring to FIG. 3, an IO configuration 300 includes a memory controller/core logic 302. The core logic 302 includes a data module 303 and a duty cycle adjuster 316. The data module 303 is configured to provide a data signal to the duty cycle adjuster 316. The duty cycle adjuster 316 is configured to adjust a duty cycle of the data signal, and to output the data signal 310 to an IO driver such as a DDR IO 305. In the IO configuration 300, the duty cycle adjuster 316 is configured to send the data signal 310 to a level shifter 304 of the DDR IO 305. The level shifter 304 shifts (e.g., amplifies) a voltage level of the incoming data signal 310. The level shifter 304 outputs the level-shifted data signal to the pre-driver 306, which may include one or more inverters or buffers, and which is configured to condition the level-shifted data signal. The pre-driver 306 outputs the conditioned data signal at node 319 to output driver leg 308d of the output driver 308 and to output driver legs 308a, 308b, 308c of the output driver 308. As shown, the output driver 308 includes four legs. However, the output driver 308 may include x legs (e.g., 4 legs, 8 legs, etc.), with y legs between node 319 and node 330, and x–y legs (e.g., if y=1, then x–y equals 3 legs, 7 legs, etc.) between node 319 and node 318. The output driver leg 308d is located within a duty cycle feedback loop that includes the duty cycle monitor 314, the duty cycle adjuster 316, the level shifter 304, and the pre-driver 306.

Unlike the IO configuration 200 shown in FIG. 2, in which the data signal from the core logic 202 is measured at a node 219 at an input of the output driver 208 (i.e., a node 219 between the pre-driver 206 and the output driver 208), the duty cycle monitor 314 of the present configuration is connected to a node 330 to monitor the duty cycle at an output of the output driver leg 308d of the output driver 308. In the present configuration, the output driver 308 is shown to include four output driver legs 308a-d, although the output driver 308 of other configurations may include more or fewer output driver legs. The duty cycle monitor 314 outputs a duty cycle monitoring signal to the duty cycle adjuster 316. The duty cycle adjuster 316 adjusts a duty cycle of the data signal from the data module 303 based on the duty cycle monitoring signal. The output driver 308 is configured to receive the conditioned, level-shifted data signal from the pre-driver 306, to output the data signal 333 to a pad at node 318, and to drive the data signal 333 across the transmission line/channel 311 to the DRAM 312.

To improve the effectiveness of the duty cycle monitor 314 (as compared to the duty cycle monitor 214 of the IO configuration 200 shown in FIG. 2), the output of the output driver leg 308d, as well as the duty cycle monitor 314, are switchably isolated from the node 318 coupled to the outputs of the remaining output driver legs 308a-c and from the load (e.g., transmission line/channel 311 and DRAM 312), while the remaining output driver legs 308a-c remain in electrical connection with the load. The isolation module 320 is configured to be in a closed/conductive state when both the duty cycle monitor 314 is not monitoring the signal 334 at the output of the output driver leg 308d and the output driver leg 308d is enabled, and is configured to be in an open/nonconductive state otherwise. When the output driver leg 308d is enabled, drv_308d_en is enabled, and when the duty cycle monitor 314 is enabled, the pad_mon_en is enabled. The isolation module 320 is configured to be in a closed/conductive state (en is at a high voltage and en_b is at a low voltage) when both the drv_308d_en is enabled and the pad_mon_en is disabled, and is configured to be in an open/nonconductive state otherwise (en is at a low voltage and en_b is at a high voltage). Accordingly, the isolation module 320 is in an open/nonconductive state when the drv_308d_en is disabled (e.g., not being utilized as part of the output driver 308, such as when the output driver leg 308d is not needed to reduce the output impedance of the output driver 308), and when both the drv_308d_en and pad_mon_en are enabled.

When the duty cycle monitor 314 is disabled and the output driver leg 308d is enabled for operation with the output driver legs 308a-c, the isolation module 320 electrically connects the output driver leg 308d to be in parallel with the output driver legs 308a-c. When the duty cycle monitor 314 is enabled while the output driver leg 308d is enabled, the isolation module 320 isolates the output driver leg 308d from the node 318 so that signal reflections (e.g., shown within the signal 333) that are reflected from the transmission line/channel 311 and the DRAM 312 (due to a mismatch in the impedances) are isolated from the duty cycle monitor 314. By isolating the signal reflections from the duty cycle monitor 314, the duty cycle adjuster 316 is able to provide improved adjustment of the duty cycle of the data signal 310.

In the present configuration 300, the output driver leg 308d that is isolated from the transmission line/channel 311 and the DRAM 312 during monitoring by the duty cycle monitor 314 is the least significant leg of the output driver 308 (i.e., of the output driver legs 308a-d, the isolated output driver leg 308d produces the smallest percentage of power of the output signal, and therefore produces less power than each of the other output driver legs 308a-c). By choosing the least significant leg 308d to be isolated from the load 311, 312 during monitoring by the duty cycle monitor 314, accuracy of the measurements by the duty cycle monitor 314 is improved, and the signal delivered to the DRAM 312 during the monitoring is affected less than if a more significant leg were used.

Referring again to FIG. 2, when the duty cycle monitor 214 is active, the output driver leg 208d may or may not be enabled depending on whether the output driver leg 208d is needed to drive the signal 233 across the transmission line/channel 211. However, in FIG. 3, when the duty cycle monitor 314 is active, the output driver leg 308d is enabled to provide an output signal at the node 330 for the duty cycle monitor 314. When the duty cycle monitor 314 is active, the output from the output driver leg 308d is not used to drive the signal 333 across the transmission line/channel 311, as the switch/isolation module 320 isolates the output from the output driver leg 308d.

As shown in FIG. 3, the isolation module 320 includes a transmission gate, which includes an n-type metal oxide semiconductor (nMOS) transistor 321 and p-type metal oxide semiconductor (pMOS) transistor 323 connected in parallel. The isolation module 320 further includes a NOR gate 322 as a part of a transmission gate control module, which receives inputs of the pad_mon_en signal and an inverted drv_308d_en signal. The NOR gate 322 outputs the en signal, which is input to the gate of the nMOS transistor 321. The en signal is inverted to provide the en_b signal, which is input to the gate of the pMOS transistor 323.

Referring again to FIG. 3, capacitance module 340 may be coupled to node 330 in order to improve the results of the duty cycle adjustment. The capacitance module 340 adds capacitance into the circuit for the duty cycle monitor 314 in order to account for the isolation of the output capacitance at node 318 by the isolation module 320. The capacitance module 340 may be a separate module, or may be part of the isolation module 320 or the duty cycle monitor 314. The capacitance module 340 includes a capacitor 341 and a transistor 342. The transistor 342 operates as a switch to connect and to disconnect the capacitor 341 to and from the node 330 as a function of en_b. The capacitor 341 may have a capacitance C equal to $1/n^{th}$ of the output capacitance of the output driver 308, where "n" is the number of output driver legs of the output driver 308. In other configurations, for improved accuracy of the duty cycle adjustment, the capacitance C may be chosen to be $1/n^{th}$ of the output capacitance of the output driver 308 less the capacitance associated with the transmission gate 321, 323 of the isolation module 320.

Referring again to FIG. 3, a driver circuit 300 includes an output driver 308, a duty cycle adjuster 316, an isolation module 320, and a duty cycle monitor 314. The output driver 308 includes a plurality of output driver legs 308a-d. The duty cycle adjuster 316 is configured to adjust a duty cycle of a signal provided to the output driver 308. The isolation module 320 is configured to isolate at least one output driver leg 308d of the output driver legs 308a-d from remaining output driver legs 308a-c of the output driver legs 308a-d. The duty cycle monitor 314 is configured to monitor an output of the at least one output driver leg 308d when the at least one output driver leg 308d is isolated from the remaining output driver legs 308a-c. The duty cycle monitor 314 is also configured to provide the monitored output (e.g., signal 334) to the duty cycle adjuster 316.

The isolation module 320 may include a transmission gate 321, 323 and a transmission gate control module 322. The transmission gate 321, 323 may be coupled between the output of the at least one output driver leg 308d and outputs of the remaining output driver legs 308a-c. The transmission gate control module 322 may be configured to close the transmission gate 321, 323 when the at least one output driver leg 308d is outputting a signal and the duty cycle monitor 314 is not monitoring the output (e.g., signal 334) of the at least one output driver leg 308d. The transmission gate control module 322 may further be configured to open the transmission gate 321, 323 when the at least one output driver leg 308d is not outputting a signal or when the duty cycle monitor 314 is monitoring the output of the at least one output driver leg 308d. The driver circuit 300 may further include a load capacitance module 340 configured to introduce a load capacitance 341 to the output of the at least one output driver leg 308d when the duty cycle monitor 314 is monitoring the output of the at least one output driver leg 308d. The load capacitance module 340 may include a transistor 342 and a capacitor 341. The driver circuit 300 may further include a level shifter 304 configured to receive a signal from the duty cycle adjuster 316 to output a level-shifted signal, and may also further include a pre-driver 306 configured to receive the level-shifted signal from the level shifter 304 and to provide a conditioned signal to the output driver 308. The output driver 308 may be configured to be coupled to a load 312 that is configured to receive an output driver signal 333 from the output driver 308. The load 312 may be DRAM 312. The driver circuit 300 may be a memory controller 300.

FIG. 4 is a flow chart 400 of a method of adjusting a data signal. The method may be performed by an apparatus, such as the IO configuration/driver circuit 300 including the duty cycle adjuster 316, the duty cycle monitor 314, and the isolation module 320 shown in FIG. 3. At 402, at least one output driver leg of an output driver is isolated from remaining output driver legs of the output driver. The at least one output driver leg may be isolated from the remaining output driver legs by operation of a transmission gate control module to open a transmission gate coupled between the output of the at least one output driver leg and outputs of the remaining output driver legs when the at least one output driver leg is outputting a signal and the output of the at least one driver leg is being monitored. The transmission gate control module may isolate the at least one output driver leg by opening the transmission gate further when the at least one output driver leg is not outputting a signal. For example, referring to FIG. 3, the driver circuit 300 may electrically isolate at least one output driver leg 308d of an output driver 308 from remaining output driver legs 308a-c of the output driver 308 by operating a transmission gate control module 320 to open a transmission gate 321, 323 coupled between the output of the at least one output driver leg 308d and outputs of the remaining output driver legs 308a-c when the at least one output driver leg 308d is outputting a signal (drv_308d_en is enabled) and the output of the at least one driver leg is being monitored (pad_mon_en is enabled), and the transmission gate control module 320 may isolate the at least one output driver leg 308d by opening the transmission gate 321, 323 when the at least one output driver leg 308d is not outputting a signal (drv_308d_en is disabled). At 404, an output of the at least one output driver leg is monitored when the at least one output driver leg is electrically isolated from the remaining output driver legs. For example, referring to FIG. 3, the duty cycle monitor 314 of the driver circuit 300 may monitor an output of the at least one output driver leg 308d when the at least one output driver leg 308d is electrically isolated from the remaining output driver legs 308a-c. At 406, a duty cycle of a signal is adjusted based on the monitoring. For example, referring to FIG. 3, the duty cycle adjuster 316 of the driver circuit 300 may adjust a duty cycle of a signal produced by the data module 303 stored in the core logic 302 based on the monitoring.

At 408, the at least one output driver leg of the output driver is electrically connected to the remaining output driver legs of the output driver after performing the monitoring. The transmission gate control module may be operated to electrically connect the at least one output driver leg to the remaining output driver legs by closing a transmission gate when the at least one output driver leg is outputting a signal and the output of the at least one driver leg is not being monitored. For example, referring to FIG. 3, the at least one output driver leg 308d of the output driver 308 may be electrically connected to the remaining output driver legs 308a-c of the output driver 308 after performing the monitoring by operating the transmission gate control module 320 to electrically connect the at least one output driver leg 308d to the remaining output driver legs 308a-c by closing a transmission gate 321, 323 when the at least one output driver leg 308d is outputting a signal and the output of the at least one driver leg 308d is not being monitored (when both pad_mon_en is disabled and drv_308d_en is enabled).

At 410, the adjusted signal is level-shifted, the level-shifted signal is conditioned, and the conditioned, level-shifted signal is driven with the at least one output driver leg when an output of the at least one output driver leg is being monitored. For example, referring to FIG. 3, the level shifter 304 may level-shift the adjusted signal 310, the pre-driver 306 may condition the level-shifted signal, and the output driver leg 308d may drive the conditioned, level-shifted signal when an output of the at least one output driver leg 308d is being monitored by the duty cycle monitor 314.

In one configuration, an apparatus is configured to adjust a data signal. The apparatus includes means for electrically isolating at least one output driver leg of an output driver from remaining output driver legs of the output driver. The means for electrically isolating is the isolation module 320. The apparatus further includes means for monitoring an output of the at least one output driver leg when the at least one output driver leg is electrically isolated from the remaining output driver legs. The means for monitoring is the duty cycle monitor 314. The apparatus further includes means for adjusting a duty cycle of a signal based on the monitoring. The means for adjusting a duty cycle is the duty cycle adjuster 316. The apparatus may further include means for electrically connecting the at least one output driver leg of the output driver to the remaining output driver legs of the output driver after the means for monitoring perform the monitoring. The means for electrically connecting is the isolation module 320. The means for electrically connecting may include a transmission gate control module configured to electrically connect the at least one output driver leg to the remaining output driver legs by closing a transmission gate when the at least one output driver leg is outputting a signal and the output of the at least one driver leg is not being monitored. The means for electrically isolating may include a transmission gate control module configured to be operated to open a transmission gate coupled between the output of the at least one output driver leg and outputs of the remaining output driver legs when the at least one output driver leg is outputting a signal and the output of the at least one driver leg is being monitored. The transmission gate control module may be configured to isolate the at least one output driver leg by opening the transmission gate further when the at least one output driver leg is not outputting a signal. The apparatus may further include means for level-shifting the adjusted signal. The apparatus may further include means for conditioning the level-shifted signal. The apparatus may further include means for driving the conditioned, level-shifted signal with the at least one output driver leg when an output of the at least one output driver leg is being monitored.

As described supra, a driver circuit includes an output driver, a duty cycle adjuster, an isolation module, and a duty cycle monitor. The duty cycle monitor monitors the output of a leg of an output driver when the leg of the output driver is electrically isolated from the remaining legs of the output driver by the isolation module. Information of the signal detected by the duty cycle monitor is delivered to a duty cycle adjuster, which adjusts a duty cycle of a signal received from a data module. Monitoring an output of the leg while the output is isolated from the output of the remaining legs improves the duty cycle adjustment.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A driver circuit, comprising:
    an output driver comprising a plurality of output driver legs;
    a duty cycle adjuster configured to adjust a duty cycle of a signal provided to the output driver;
    an isolation module configured to isolate at least one output driver leg of the output driver legs from remaining output driver legs of the output driver legs; and
    a duty cycle monitor configured to monitor an output of the at least one output driver leg when the at least one output driver leg is isolated from the remaining output driver legs, and to provide the monitored output to the duty cycle adjuster.

2. The driver circuit of claim 1, wherein the isolation module comprises a transmission gate and a transmission gate control module, the transmission gate being coupled between the output of the at least one output driver leg and outputs of the remaining output driver legs, the transmission gate control module being configured to close the transmission gate when the at least one output driver leg is outputting a signal and the duty cycle monitor is not monitoring the output of the at least one output driver leg.

3. The driver circuit of claim 2, wherein the transmission gate control module is further configured to open the transmission gate when the at least one output driver leg is not outputting a signal or the duty cycle monitor is monitoring the output of the at least one output driver leg.

4. The driver circuit of claim 2, further comprising a load capacitance module configured to introduce a load capacitance to the output of the at least one output driver leg when the duty cycle monitor is monitoring the output of the at least one output driver leg.

5. The driver circuit of claim 4, wherein the load capacitance module comprises a transistor and a capacitor.

6. The driver circuit of claim 1, further comprising:
    a level shifter configured to receive a signal from the duty cycle adjuster to output a level-shifted signal; and
    a pre-driver configured to receive the level-shifted signal from the level shifter and to provide a conditioned signal to the output driver.

7. The driver circuit of claim 1, wherein the output driver is configured to be coupled to a load that is configured to receive an output driver signal from the output driver.

8. The driver circuit of claim 7, wherein the load is a dynamic random-access memory.

9. The driver circuit of claim 1, wherein the driver circuit comprises a memory controller.

10. A method of adjusting a data signal, the method comprising:
electrically isolating at least one output driver leg of an output driver from remaining output driver legs of the output driver;
monitoring an output of the at least one output driver leg when the at least one output driver leg is electrically isolated from the remaining output driver legs; and
adjusting a duty cycle of a signal based on the monitoring.

11. The method of claim 10, further comprising electrically connecting the at least one output driver leg of the output driver to the remaining output driver legs of the output driver after performing the monitoring.

12. The method of claim 11, wherein a transmission gate control module electrically connects the at least one output driver leg to the remaining output driver legs by closing a transmission gate when the at least one output driver leg is outputting a signal and the output of the at least one driver leg is not being monitored.

13. The method of claim 10, wherein the electrically isolating comprises operating a transmission gate control module to open a transmission gate coupled between the output of the at least one output driver leg and outputs of the remaining output driver legs when the at least one output driver leg is outputting a signal and the output of the at least one driver leg is being monitored.

14. The method of claim 13, wherein the transmission gate control module isolates the at least one output driver leg by opening the transmission gate further when the at least one output driver leg is not outputting a signal.

15. The method of claim 10, further comprising:
level-shifting the adjusted signal;
conditioning the level-shifted signal; and
driving the conditioned, level-shifted signal with the at least one output driver leg when an output of the at least one output driver leg is being monitored.

16. An apparatus for adjusting a data signal, the apparatus comprising:
means for electrically isolating at least one output driver leg of an output driver from remaining output driver legs of the output driver;
means for monitoring an output of the at least one output driver leg when the at least one output driver leg is electrically isolated from the remaining output driver legs; and
means for adjusting a duty cycle of a signal based on the monitoring.

17. The apparatus of claim 16, further comprising means for electrically connecting the at least one output driver leg of the output driver to the remaining output driver legs of the output driver after the means for monitoring perform the monitoring.

18. The apparatus of claim 17, wherein the means for electrically connecting comprise a transmission gate control module configured to electrically connect the at least one output driver leg to the remaining output driver legs by closing a transmission gate when the at least one output driver leg is outputting a signal and the output of the at least one driver leg is not being monitored.

19. The apparatus of claim 16, wherein the means for electrically isolating comprise a transmission gate control module configured to be operated to open a transmission gate coupled between the output of the at least one output driver leg and outputs of the remaining output driver legs when the at least one output driver leg is outputting a signal and the output of the at least one driver leg is being monitored.

20. The apparatus of claim 19, wherein the transmission gate control module is configured to isolate the at least one output driver leg by opening the transmission gate further when the at least one output driver leg is not outputting a signal.

21. The apparatus of claim 16, further comprising:
means for level-shifting the adjusted signal;
means for conditioning the level-shifted signal; and
means for driving the conditioned, level-shifted signal with the at least one output driver leg when an output of the at least one output driver leg is being monitored.

* * * * *